(12) United States Patent
Rancoule

(10) Patent No.: US 7,833,490 B2
(45) Date of Patent: Nov. 16, 2010

(54) CRUCIBLE FOR THE TREATMENT OF MOLTEN SILICON

(75) Inventor: Gilbert Rancoule, Marcq-en-Baroeul (FR)

(73) Assignee: Vesuvius Crucible Company, Wilmington, DE (US)

( * ) Notice: Subject to any disclaimer, the term of this patent is extended or adjusted under 35 U.S.C. 154(b) by 0 days.

(21) Appl. No.: 12/159,865

(22) PCT Filed: Jan. 12, 2007

(86) PCT No.: PCT/EP2007/000254
§ 371 (c)(1),
(2), (4) Date: Jul. 2, 2008

(87) PCT Pub. No.: WO2007/080120
PCT Pub. Date: Jul. 19, 2007

(65) Prior Publication Data
US 2008/0292524 A1    Nov. 27, 2008

(30) Foreign Application Priority Data
Jan. 12, 2006    (EP)    .................................. 06447007

(51) Int. Cl.
*B01L 3/04*    (2006.01)
(52) U.S. Cl. ...................................... 422/102; 423/349
(58) Field of Classification Search .................. 423/349, 423/348; 422/102
See application file for complete search history.

(56) References Cited

U.S. PATENT DOCUMENTS

| 4,013,746 | A | * | 3/1977 | Goreham et al. ............. 264/620 |
| 4,141,726 | A | * | 2/1979 | Yajima et al. .................. 75/229 |
| 4,316,936 | A | * | 2/1982 | Hing ........................... 428/325 |
| 4,753,783 | A | * | 6/1988 | Sanjurjo ....................... 423/350 |
| 4,787,986 | A | * | 11/1988 | Dietl et al. .................... 210/773 |
| 5,037,503 | A | * | 8/1991 | Kajimoto et al. .............. 117/31 |
| 6,048,813 | A | * | 4/2000 | Hunter .......................... 501/86 |
| 6,165,425 | A | * | 12/2000 | Lange et al. .................. 422/243 |
| 2005/0022743 | A1 | * | 2/2005 | Sakata et al. ................. 118/726 |
| 2005/0178319 | A1 | * | 8/2005 | Korus et al. .................. 117/200 |
| 2005/0247259 | A1 | * | 11/2005 | Yoon et al. ..................... 117/13 |
| 2006/0202208 | A1 | * | 9/2006 | Tsukuda ......................... 257/75 |
| 2006/0219162 | A1 | * | 10/2006 | Parthasarathy et al. ...... 117/208 |
| 2006/0249071 | A1 | * | 11/2006 | Sachs ............................ 117/26 |
| 2006/0270199 | A1 | * | 11/2006 | Shimamune et al. ........ 438/479 |

FOREIGN PATENT DOCUMENTS

| DE | 962868 C | 4/1957 |
| WO | 2004/016835 A1 | 2/2004 |
| WO | 2004/053207 A1 | 6/2004 |
| WO | 2005/106084 A1 | 11/2005 |
| WO | 2007/003354 A1 | 1/2007 |
| WO | 2007/039310 A1 | 4/2007 |

OTHER PUBLICATIONS

Hide, I., et al., "Mould shaping silicon crystal growth with a mould coating material by the spinning method", Journal of Crystal Growth, Elsevier, Amsterdam, NL, vol. 79, No. 1-3, Dec. 1986, pp. 583-589, XP002252583, ISSN 0222-0248, p. 584, table 1.

* cited by examiner

*Primary Examiner*—Timothy C Vanoy
*Assistant Examiner*—Michelle Hou
(74) *Attorney, Agent, or Firm*—Thomas Clinton; Donald M. Satina

(57) ABSTRACT

A crucible for the treatment of molten silicon includes a basic body with a bottom surface and lateral walls defining an inner volume. The basic body comprises at least 65% by weight of silicon carbide, and from 12 to 30% by weight of a constituent selected from silicon oxide or nitride. Moreover, the basic body comprises at least one silicon oxide and/or nitride coating, at least on the surfaces defining the inner volume of the crucible.

10 Claims, No Drawings

CRUCIBLE FOR THE TREATMENT OF MOLTEN SILICON

BACKGROUND OF THE INVENTION

1. Field of the Invention

The present invention relates to a crucible for the treatment of molten silicon, to the manufacture of such crucible and to the use of such crucible for treating molten silicon.

2. Description of the Related Art

Nowadays, the demand for high purity silicon has significantly increased. The applications of high purity silicon in the generation of photovoltaic energy are widely spread. Successive energy crises have strengthened that need.

The object of the present application is a vessel used for the treatment of molten silicon. Such treatment can consist in the silicon crystallization, either by directional solidification or by drawing of a crystal from a molten bath. The treatment can also consist in a metallurgical treatment intended for the production of very highly pure silicon or one of its alloys. It can thus consist in a metallurgical treatment of alloys or ores aiming at eliminating certain impurities.

For such kinds of applications, it is well known to use crucibles from quartz or based on other materials essentially constituted of silicon dioxide (see for example the document DE-C-962868). Indeed, since the main constituent of the crucible is silicon under the form of one of its oxides, the contamination risk by other chemical compounds is strongly reduced. The quartz crucibles present however the major drawback of being attacked by molten silicon, with the consequence that the solidifying silicon ingot tends to adhere to the walls of the quartz crucible. Since the quartz and silicon have different coefficients of thermal expansion, very significant mechanical stresses can be generated either inside the ingot resulting in crystallization defects, or in the crucible walls resulting into the crucible cracking. Further, the silicon ingot once solidified strongly adheres to the crucible walls and it is practically impossible to extract the ingot without destroying the crucible or at least seriously damaging it.

The quartz and certain silica derivatives are also known to be subject to crystallographic phase changes during their thermal cycling. These crystallographic phase changes induce very high mechanical stresses within the crucible walls. Further, they can also induce changes of density and, therewith, of thermal conductivity within the wall, leading to problems of losses of homogeneity of the transmission or withdrawal of energy towards or from silicon. So far, this crucial problem has not found a solution likely to be industrially carried out.

Moreover, at the temperatures of use, quartz is subject to geometrical changes. These geometrical changes are relatively difficult to manage since the treatment furnace wherein the vessel containing molten silicon stands must heat in a fully controlled way the quantity of silicon being treated. Any deformation of the vessel wall induces a loss of homogeneity of the transmission of withdrawal of energy towards or from silicon which adds to the loss of geometry of the silicon ingot during the crystallization.

This problem has been partly remedied by reinforcing the external walls of the quartz crucible by carbon plates, more particularly by graphite plates.

Such carbon plates, and more particularly graphite plates are widely used in all kinds of processes carried out at high temperature due to their excellent resistance to thermal stresses for quite long periods. For example, graphite crucibles have been used to receive a germanium bath during the carrying over of a process of crystal drawing according to the Czochralski method. So far, it has however not been possible to use such graphite crucibles for the treatment of silicon since, at high temperature, the molten silicon bath attacks the graphite walls and forms silicon carbide, the presence of which being incompatible with the required purity. According to the currently used technique, as indicated hereabove, the different processes of treating silicon at high temperature take place in quartz or other silica based materials crucibles of which the walls have been reinforced with carbon, more particularly graphite, plates.

This technique either is not problem-free. It is indeed well known that the gaseous phases, in the neighboring of the molten silicon bath, influence the formation of an equilibrium between the silicon vapor escaping from the molten silicon bath and the carbon monoxide atmosphere prevailing in the furnace. Reactions are observed as well on carbon or graphite as in the silicon bath, leading to a change of physical and mechanical properties.

Starting from the same concept consisting of avoiding introducing other constituents than silicon, it has also been proposed in the state of the art to use silicon nitride crucibles. Therefore, document WO-A1-2004/016835 discloses a crucible essentially constituted of silicon nitride. Even though some of the properties of this crucible are satisfactory, its price makes its use currently unrealistic. Further, it has been reported that these crucibles are also sensitive to deformation at high temperature.

The applicant has thus set as an objective the provision of a vessel for the treatment of molten silicon which would not present the drawbacks observed in the prior art. In particular, it would be desirable that the crucible could be used a certain number of times without any significant degradation of its physical integrity. Moreover, the thermal conductivity properties of the crucible in question should not change in the course of its use; in other words, that the material be not sensitive either to deformation or to crystallographic phase changes. Eventually, it is necessary that the crucible be not a source of silicon pollution.

BRIEF SUMMARY OF THE INVENTION

The applicant has established that these objectives and others are reached with a crucible according to claim 1. Such a crucible comprises thus a basic body with a bottom surface and lateral walls defining an inner volume, mainly constituted (at least 65% by weight of the material) of silicon carbide. It is actually surprising that a crucible for the treatment of molten silicon could be manufactured from a material mainly constituted of silicon carbide. Indeed, until now, the skilled person has always tried to avoid the presence of silicon carbide which is perceived as a problem in any process for the treatment of molten silicon.

On the contrary, the applicant has demonstrated that a crucible comprising a basic body mainly constituted of silicon carbide does not present the drawbacks observed with conventional crucibles. In particular, the fact that the main component of the basic body consists in silicon carbide showing a well defined crystallographic phase which is not subject to phase transition at the temperatures of treatment of the molten silicon, permits the suppression of the problems of loss of homogeneity of the transfer/withdrawal of energy observed with conventional crucibles. Further, silicon carbide does not have plastic phases at these temperatures and, therefore, is not subject to deformation.

Thanks to these excellent properties, such a crucible can be reused a significant number of times while conventional crucibles must be replaced after each use. It is very surprising that the solution to this problem comes precisely from the use of a material which has been considered until now as a source of problems.

DETAILED DESCRIPTION OF THE INVENTION

The material forming the crucible basic body further comprises from 12 to 30% by weight of one or more constituents selected from silicon oxide or nitride. The remainder of the material forming the basic body can comprise up to 13% by weight of one or several other constituents such as binders (chemical, hydraulic or other), agents regulating the fluidity of the composition before shaping and curing, etc.

The constituent selected from silicon oxide or nitride can be introduced as such in the composition used to form the basic body or can be introduced under the form of metallic silicon that will be either oxidized or nitrided during the curing of the crucible. The curing conditions (nitriding or oxidizing atmosphere) shall thus be selected according to the desired composition. It will be noted that the silicon oxide can also have an effect on the fluidity of the composition before shaping and curing as well as a binding effect, in particular when this compound is introduced under the form of fumed silica. In such a case, obviously, it is taken into account only once (in the 12 to 30% by weight of one or more constituents selected from silicon oxide and/or nitride).

Other viscosity regulating agents can also be introduced in order to modify the hot properties of the crucible. The addition of fine reactive alumina particles (grain size lower or equal to 200 μm) is particularly advantageous for its effect of modifying the fluidity during its shaping as well as its binding effect after curing.

Other binders that could be used comprise for example organic resins (leaving a carbonaceous residue after curing), magnesia and calcium aluminate and/or silicate. According to an advantageous embodiment, the bond is generated by the formation in situ of a silicon nitride or oxide type bond. Such a bond is easily obtained by regulating the curing conditions of the article and, in particular, the curing atmosphere of the article.

Further, it has been established that it is necessary to provide the crucible internal walls of a coating of the type silicon nitride as described, for example, in WO-A1-2004/053207 or WO-A1-07/039310A1, or of the type silicon oxide or of a combination thereof as disclosed for example in WO 07/003354 or in the document WO-A1-2005/106084. Generally, an oxide type coating is used for the crystallization of silicon as a monocrystal and of the nitride type for the polycrystalline crystallization of silicon. It will be noted that the coating can be produced during the curing of a raw crucible comprising silicon (for example a curing in nitriding atmosphere will produce a surface coating of silicon nitride while an oxidizing atmosphere curing will produce a surface coating of the silicon oxide type).

According to the invention, the basic body is bonded. As indicated above, the binder can be a hydraulic binder (for example calcium silicate or aluminate) forming thereby a cement like composition, of a chemical binder (for example magnesium silicate) or of a cement-free type binder (for example gels, orthosilicates, etc.) or also a bond produced by reactive binding (carbon bond, nitriding curing, etc.).

Advantageously, the silicon carbide will be used according to a well defined granulometric distribution. In particular, it is preferable that the coarser grains fraction be constituted of silicon carbide so as to provide a silicon carbide matrix constituted of coarse grains wherein finer grains of silicon nitride or oxide will be present. The majority of silicon carbide will thus be preferably constituted of grains having a particle size larger than 200 μm while the silicon oxide, the silicon nitride and/or the metallic silicon grains will preferably be introduced under the form of grains having a particle size lower than 10 μm.

The following examples illustrate several embodiments of the invention. In the following Table I, several examples of materials according to the invention constituting the basic body of crucibles for the treatment of molten silica are provided. In this Table, the first column indicates the nature of the constituents, columns 2 to 13 indicate the weight percentages of the different constituents. The examples A1, A2, C1, C2, E1 and E2 illustrate several variants of hydraulic binders. Examples A to F illustrate different variants of chemical or reactive binding.

Crucibles have been prepared from these materials and their internal walls have been coated with a silicon nitride or oxide type coating. Crystallization of the same quantity of silicon has been performed in each of these crucibles. It has been observed thereby that none of these crucibles had been damaged during the silicon crystallization so that they could be immediately reused in a further crystallization operation without requiring any repairing step.

Numerous modifications and variations of the present invention are possible. It is, therefore, to be understood that within the scope of the following claims, the invention may be practiced otherwise than as specifically described.

TABLE I

|  | A1 | A2 | A | B | C1 | C2 | C | D | E1 | E2 | E | F |
|---|---|---|---|---|---|---|---|---|---|---|---|---|
| Silicon carbide 1-3 mm | 25 | 25 | 25 | 25 | 20 | 20 | 20 | 20 | 25 | 25 | 25 | 22 |
| Silicon carbide 0.2-1 mm | 20 | 20 | 20 | 20 | 30 | 30 | 30 | 25 | 25 | 25 | 25 | 25 |
| Silicon carbide <.025 mm | 30 | 30 | 30 | 30 | 30 | 30 | 30 | 30 | 20 | 20 | 20 | 20 |
| Total silicon carbide | 75 | 75 | 75 | 75 | 80 | 80 | 80 | 75 | 70 | 70 | 70 | 67 |
| Silicon nitride | 17 | 15 | 17 | 10 | 15 | 8 | 18 |  | 25 | 10 | 25 | 17 |
| Silicon oxide | 5 | 8 | 5 | 5 |  | 4 |  | 12 |  | 6 |  | 10 |
| Total nitride and oxide | 22 | 23 | 22 | 15 | 15 | 12 | 18 | 12 | 25 | 16 | 25 | 27 |

TABLE I-continued

|  | A1 | A2 | A | B | C1 | C2 | C | D | E1 | E2 | E | F |
|---|---|---|---|---|---|---|---|---|---|---|---|---|
| Alumina | 1 |  | 2 | 8 |  | 3 |  | 9 | 2 | 11 | 3 | 2 |
| Calcium aluminate | 2 | 2 |  |  | 5 | 5 |  |  | 3 | 3 |  |  |
| Magnesium oxide |  |  | 1 |  |  |  | 2 |  |  |  | 2 | 1 |
| Carbon |  |  |  | 2 |  |  |  | 4 |  |  |  | 3 |
| Total others | 3 | 2 | 3 | 10 | 5 | 8 | 2 | 13 | 5 | 14 | 5 | 6 |
| Total | 100 | 100 | 100 | 100 | 100 | 100 | 100 | 100 | 100 | 100 | 100 | 100 |

I claim:

1. Crucible for the treatment of molten silicon comprising a basic body with a bottom surface and lateral walls defining an inner volume, the basic body comprising
   at least 65% by weight of silicon carbide;
   from 12 to 30% by weight of a constituent selected from the group consisting of silicon oxide and silicon nitride,
the basic body further comprising a surface coating comprising a constituent selected from the group consisting of silicon oxide, silicon nitride and combinations thereof, on the surfaces defining the inner volume of the crucible.

2. Crucible according to claim 1, wherein the basic body further comprises up to 13% by weight of a constituent selected from the group consisting of carbon, magnesium oxide, aluminum oxide, calcium silicate, calcium aluminate, and combinations thereof.

3. Crucible according to claim 1, wherein a silicon oxide layer is present between the surface coating and the wall of the surfaces defining the inner volume of the crucible.

4. Crucible according to claim 1, wherein the basic body wall comprises a side opposite to a side defining the inner volume, and wherein a silicon oxide layer is present at the surface of the basic body walls, on the side opposite to the side defining the inner volume.

5. Crucible according to claim 1, wherein at least 50% by weight of the silicon carbide is comprised of grains having a particle size larger than 200 μm.

6. Crucible according to claim 1, wherein the silicon oxide or nitride is comprised of grains having a particle size lower than 10 μm.

7. Process for the manufacture of a crucible for the treatment of molten silicon comprising a basic body with a bottom surface and lateral walls defining an inner volume, the basic body comprising at least 65% by weight of silicon carbide, from 12 to 30% by weight of a constituent selected from the group consisting of silicon oxide and silicon nitride and further comprising a coating comprising a constituent selected from the group consisting of silicon oxide, silicon nitride and combinations thereof, the process comprising the following steps:

a) shaping of the basic body with a bottom surface and lateral walls defining an inner volume;
   b) drying of the basic body;
   c) curing of the basic body; and
   d) forming a coating comprising a constituent selected from the group consisting of silicon oxide, silicon nitride and combinations thereof on the surfaces defining the inner volume of the crucible.

8. Process according to claim 7, wherein steps c) and d) are carried out simultaneously by curing the basic body in an oxidizing or nitriding atmosphere.

9. Process according to claim 7, wherein step d) of formation of the coating comprises applying the coating before the step of curing the basic body.

10. A method for the treatment of silicon, silicon alloys or silicon ores, comprising:
   a) providing a crucible comprising a basic body with a bottom surface and lateral walls defining an inner volume, the basic body comprising at least 65% by weight of silicon carbide, from 12 to 30% by weight of a constituent selected from the group consisting of silicon oxide, silicon nitride and combinations thereof, and further comprising a coating comprising a constituent selected from the group consisting of silicon oxide, silicon nitride and combinations thereof, on the surfaces defining the inner volume of the crucible,
   b) introducing a material selected from the group consisting of molten silicon, molten silicon alloy and molten silicon ore into the crucible,
   c) treating the material by a process selected from the group consisting of:
      i) crystallizing silicon by directional solidification,
      ii) crystallizing silicon by drawing a crystal from a molten bath, and
      iii) treating silicon alloy or silicon ore to eliminate impurities.

* * * * *